United States Patent [19]

Turner et al.

[11] 4,366,338

[45] Dec. 28, 1982

[54] COMPENSATING SEMICONDUCTOR MATERIALS

[75] Inventors: George W. Turner, Stoneham; John C. C. Fan, Chestnut Hill; Jack P. Salerno, Waltham, all of Mass.

[73] Assignee: Massachusetts Institute of Technology, Cambridge, Mass.

[21] Appl. No.: 223,768

[22] Filed: Jan. 9, 1981

[51] Int. Cl.³ .................... H01L 31/06; H01L 31/18
[52] U.S. Cl. .................................. 136/258; 136/262; 148/15; 148/188; 204/37 R; 204/37 T; 357/30; 357/59; 357/63; 357/64
[58] Field of Search ................................ 148/1.5, 188; 136/258 PC, 261, 262; 204/37 R, 37 T; 357/30, 59, 63, 64; 29/572

[56] References Cited

U.S. PATENT DOCUMENTS

| | | | |
|---|---|---|---|
| 2,995,475 | 8/1961 | Sharpless | 117/213 |
| 3,340,599 | 9/1967 | Ellis | 29/572 |
| 4,078,945 | 3/1978 | Gonsiorawski | 136/256 |
| 4,082,889 | 4/1978 | Di Stefano | 428/328 |
| 4,197,141 | 4/1980 | Bozler et al. | 136/258 |
| 4,249,957 | 2/1981 | Koliwad et al. | 136/258 |
| 4,320,168 | 3/1982 | Lindmayer | 428/332 |

OTHER PUBLICATIONS

J. W. McPherson et al., "Band Bending & Passivation Studies of GaAs Grain Boundaries", *J. Electrochem. Soc.*, vol. 127, pp. 2713-2721 (1980).

M. H. Brodsky, "Making Higher Efficiency Solar Cells with Polcrystalline Si Films", *IBM Tech. Disc. Bull.*, vol. 18, pp. 582-583 (1975).

G. W. Turner et al., "Efficient Large-Grained GaAs Homojunction Solar Cells", *Conf. Record*, 14th *IEEE Photovoltaic Specialists Conference* (1980), pp. 1330-1332.

"Thermal diffusion of tin in GaAs from a spin-on $SnO_2/SiO_2$ source" by Nissim et al. in *Appl. Phys. Lett* 37(1), Jul. 1, 1980.

"Amorphous Silicon Solar Cells" by David E. Carlson in *Transactions on Electron Devices*, vol. ED-24, No. 4, Apr. 1977.

*Primary Examiner*—Aaron Weisstuch
*Attorney, Agent, or Firm*—Arthur A. Smith, Jr.; Leo R. Reynolds

[57] ABSTRACT

A method of compensating grain boundaries or dislocations causing interstices to form particularly in polycrystalline semiconductor materials is disclosed which comprises selectively diffusing opposite impurity-type donor semiconductor material into the interstice to thereby reduce the conductivity of the interstice.

16 Claims, 3 Drawing Figures

COMPENSATING SEMICONDUCTOR MATERIALS

GOVERNMENT SUPPORT

This invention was partially supported by Grant No. F19(628)-78-C-0002 from the U.S. Air Force.

TECHNICAL FIELD

This invention is in the field of semiconductor materials and more specifically semiconductor materials for photovoltaic cells.

BACKGROUND ART

Photovoltaic cells have been developed which generate electrical energy directly from sunlight. Typically, such cells have been fabricated from semiconductor materials containing a rectifying junction, such as a p-n junction or a Schottky barrier.

A number of problems have been encountered, however, in attempts to produce photovoltaic cells which would have wide acceptance for use in producing energy from sunlight. One of the problems has been the cost of producing such cells, which has heretofore been relatively high. In fact, the cost of photovoltaic cells has generally been considered to be severely limiting except in applications where cost is not a controlling factor, such as in space applications or generation of power in remote areas.

The high cost of producing photovoltaic cells is due in large measure to the requirement for near crystal perfection and to the elaborate procedures involved in semiconductor wafer preparation. In regard to crystal perfection, it has almost universally been widely believed that only single crystal semiconductor materials could produce reasonable cell efficiencies. Polycrystalline semiconductor materials, on the other hand, have generally been unacceptable because of the degradation of the photovoltaic response caused in part by the shorting effect of grain boundaries (intersections between individual crystallites).

Because of the problems encountered with polycrystalline materials, they have not heretofore found wide acceptance for use in photovoltaic cells. Furthermore, those few photovoltaic cells which have employed polycrystalline materials have heretofore had much lower cell efficiencies than corresponding cells based upon single crystal semiconductor materials. Thus, although polycrystalline materials can be produced relatively inexpensively compared to single crystal materials, they have not been employed to any great extent in photovoltaic cells and, even when employed, have produced unsatisfactory photovoltaic cell efficiencies.

One solution to the problem posed by grain boundaries or other defects in polycrystalline semiconductor materials is the passivation process taught in U.S. Pat. No. 4,197,141 by Bozler and Fan. In this prior art process, passivation is generally accomplished by selective deposition of insulating caps at the points where the grain boundaries intersect a surface of the semiconductor material. The process entails employing the semiconductor material as an electrode in an electrolytic cell and passing electrical current along the grain boundaries. This produces anodization or selective deposition of an oxide cap at the surface intersection of the grain boundaries.

While the process of U.S. Pat. No. 4,197,141 represented a significant advance in the state-of-the-art at the time the invention was made, nevertheless, it only corrected the detrimental effects of grain boundaries or other dislocation defects at the surface between the contact bars or fingers and the top layer of the rectifying junction, or in the words of the patent, at the surface intersection of the grain boundaries. The process did not compensate the shorting effects caused by grain boundaries within the layer.

Consequently, a need exists for a simple, inexpensive, and more effective way of passivating grain boundaries or dislocation defects within one or more layers of a polycrystalline or single crystal semiconductors in order to compensate for the detrimental shorting effects of such grain boundaries or dislocations.

DISCLOSURE OF THE INVENTION

The invention comprises a method and the product resulting therefrom for alleviating the detrimental effects of grain boundaries or dislocation defects causing transverse interstices in multi-layered semiconductor materials. In the method, suitable dopant material is actively introduced into the interstices. The atoms of the dopant material are of opposite type conductivity to the conductivity at or, associated with, the interstice and the conductivity of the interstice is thereby "compensated."

Compensation is a method of reducing the conductivity of a doped semiconductor by introducing dopant atoms of the opposite electrical type into the semiconductor. A doped semiconductor is a semiconductor which has a conductivity different than that of the intrinsic state. For example, if the conductivity is p-type conductivity such as produced by Zn atoms in GaAs, in order to compensate such a p-type conductivity, n-type dopant atoms such as tin would be introduced. This opposite type dopant reduces the conductivity of the material by shifting the energy distribution of the mobile carriers toward a less conducting state. When a doped semiconductor is in the least conducting state it is said to be fully compensated.

By reducing the conductivity of the normally highly conducting interstices, these conductive paths through the semiconductor layers are reduced and, in the case of photovoltaic devices, photovoltage increases and thus power conversion efficiency is increased.

One explanation we have found for the detrimental shorting effect of grain boundaries, or for that matter, other crystalline defects such as dislocations, is that dopant atoms from the previously deposited layers of a device diffuse back up these interstices, causing a change in the conductivity at the interstice. For example, in a semiconductor device formed by deposition of successive layers of $p^+$, p and $n^+$-layers to form an $n^+/p/p^+$ semiconductor structure, it is possible that p-type conductivity dopant atoms may be diffused or otherwise travel from the bottom $p^+$-layer to the $n^+$-layer via the interstices created by grain boundaries or other defects running through the layers.

A shorting effect then results from the fact that the grain boundaries may possess properties which are different from the bulk crystal properties, including their electrical properties. In the example shown above, a shorting effect will be produced since the interstice in the $n^+$-layer becomes doped with p-type dopant. The result is a low open circuit voltage in the device which produces a concomitant reduction in photovoltaic cell efficiency. These shorting effects become especially detrimental if contact fingers or bars fall on these grain boundaries. Also, the presence of p-type interstices in the n+-layer increases the series resistance, thus lowering the fill factor of the cells.

The dopant atoms may be introduced selectively into the interstices of grain boundaries or dislocations by selective electroplating, or may be deposited over the entire surface of the polycrystalline semiconductor by various processes, such as, vacuum deposition or normal electroplating. Once the passivation has been achieved, any excess dopant atoms are removed and the processing of the device can be continued as usual.

Incorporation of the dopant atoms into the interstices is preferably achieved by diffusing the dopant into the semiconductor layers by a thermal heating cycle process. Thermal diffusion offers the advantage that the diffusion of impurities such as dopant atoms along grain boundaries is much higher than in the bulk of the polycrystalline semiconductor.

In a specific application an n-type dopant, such as tin(Sn) was deposited on large-grain polycrystalline gallium arsenide (GaAs) grown with an n+/p/p+ structure.

Normally, such structures exhibit low open circuit voltages ($V_{oc}$) with photovoltaic cells made from such structures. Values of $V_{oc} \cong 0.3$–$0.5$ V are normally found due to the detrimental shunting effect of conducting grain boundaries. With passivation, in accordance with the present invention, $V_{oc}$ values of 0.8–0.9 V have been measured. Since the output current from these cells shows little change upon passivation, this increase in output voltage corresponds to an increase in output power of up to 100%. While the present nature of this passivation process is not fully understood, it is believed that the Sn (n-type dopant) compensates grain boundaries which would otherwise short the junction of the cell by p-type conduction. The sheet resistance of the passivated layer is also lowered in the process, thereby increasing fill factor and thus the conversion efficiency is increased.

BEST MODE OF CARRYING OUT THE INVENTION

Preferred embodiments of this invention will now be described in more detail with reference to the Figures.

Figure 1:
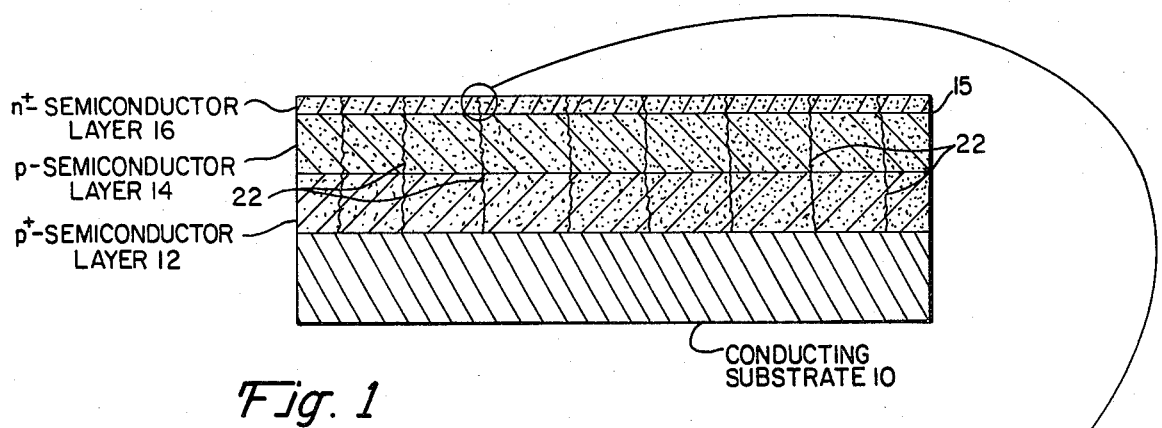
FIG. 1 is a cross-sectional view of a photovoltaic device employing polycrystalline materials suitably doped to provide a rectifying junction and containing grain boundaries passivated in accordance with the invention.

FIG. 1 illustrates a photovoltaic device, based upon a rectifying junction 15 formed in polycrystalline semiconductor material. The device has a conducting substrate 10, which may be formed from a material such as graphite, molybdenum or tungsten. In some cases, the semiconductor itself can serve as a conducting substrate if it is appropriately doped. Successive layers 12, 14 and 16, respectively, of p+-semiconductor material, p-semiconductor material, and n+-semiconductor material, respectively, are deposited upon conducting substrate 10 by well known processes. Semiconductor layers 12, 14, and 16 are preferably formed from gallium arsenide, suitably doped to provide the desired electrical properties. Thus, semiconductor layer 12 may be gallium arsenide suitably doped with p-dopants such as zinc, cadmium, beryllium or magnesium to a carrier level of $10^{18}$ $CC^{-1}$ or above; semiconductor layer 14 may be a gallium arsenide layer suitably doped with p-dopants to a carrier level of $10^{16}$–$10^{17}$; $CC^{-1}$ and n+-semiconductor layer 16 may be gallium arsenide suitably doped with n-dopants such as sulfur, selenium or silicon to a carrier concentration of $10^{17}$ $CC^{-1}$ or above.

Grain boundaries or other dislocation defects form interstices 22 which extend through each of semiconductor layers 12, 14 and 16. Such interstices may originate in p+-semiconductor layer 12, which is formed from polycrystalline material, and extend through layers 14 and 16. These interstices produce a shorting effect across junction 15. Thus, the open circuit voltage of the device is significantly less than would be the case if such grain boundaries were not present, and this results in a much lower photovoltaic conversion efficiency.

Figure 2:
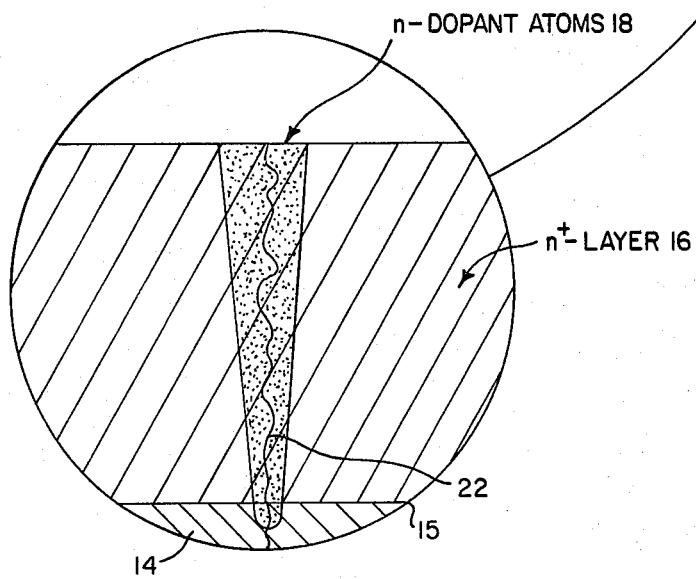
FIG. 2 is an enlarged view of the section circled in FIG. 1.

In an n+/p/p+ structure as shown in FIGS. 1 and 2 formed by depositing alternate layers of conductivity type p+ (layer 12) p (layer 14) and n+ (layer 16), we have found that the interstices in n+-layer 16 may be compensated by introducing dopant atoms of n-type, such as tin (Sn). We believe compensation occurs because the interstice 22 at n+-layer 16 is of p-type conductivity as a result of backward diffusion up the interstices of p-type donor atoms from lower layers 14 and 12. Thus, the introduction of opposite conductivity n-type donor atoms into the interstice 22 on layer 16 up to and slightly beyond junction 15 tends to reduce the conductivity at the interstice by shifting the energy distribution of mobile carriers toward a less conducting state. Ideally, a quantity of n-type dopant is introduced sufficient to just compensate the region at the interstice 22 and particularly at the intersection of the interstice with junction 15.

While the invention will be described in connection with an n+/p/p+ gallium arsenide structure, it should be noted that the invention is not limited thereby. For example, a p+/n/n+ structure is also contemplated wherein the top layer is a p+-layer and the bottom layer is n+. In such a device, n-type donor atoms are expected to travel up the interstice from the bottom layer. Therefore, to compensate the device, p-type donor atoms would be introduced by diffusing Be, Zn or Cd into the top layer.

In accordance with the present invention, the compensating dopants may be introduced by selectively electroplating the grain boundary portions of the external surface of layer 16 with a dopant material of opposite conductivity to the type of conductivity exhibited at the interstice and then heating the device to achieve diffusion of dopant atoms from the selectively electroplated surfaces of layer 16.

To selectively electroplate grain boundaries in polycrystalline semiconductors, solutions with poor "throwing power" and "covering power" (See Lowenheim, F. A., *Electroplating*, McGraw-Hill, 1978.) are used. Throwing power is defined as the ability of a plating solution to cover irregular surfaces. Covering power is defined as the ability to plate at low current densities. Since the polycrystalline semiconductor surface is irregular and of varying conductivity, a plating solution can be chosen to selectively plate in the grain boundary areas.

Electroplating solutions of low throwing and covering power are made by altering the content of organic additivies used.

It should be understood that in some applications rather than selectively electroplating the grain boundaries, the entire surface of layer 16 may be electroplated with dopant material and any excess after diffusion may be removed by etching.

A typical acidic plating solution used for the electroplating of tin consists of 325 ml. of water, 71 ml. of fluoboric acid, 125 ml. of stannous fluoborate, 3.0 g. of gelatine, and 0.5 g. of β-napthol. When this solution is freshly prepared it exhibits very good throwing and covering power. However, if the solution is allowed to stand for a few weeks, a precipitate forms on the bottom of the container. This precipitate consists primarily of gelatine. If the gelatine depleted solution is used to electroplate, the throwing and covering power are reduced and the selective electroplating only in grain boundaries can be performed.

After the dopant material is suitably electroplated on layer 16, the structure is subjected to a heating cycle by well known means sufficient to cause diffusion of the dopant atoms 18 into the periphery of the grain boundaries 22 on layer 16. The duration and temperature of the heat cycle is dependent on the materials used and the thickness of layer 16. Preferably, the diffusion of n-dopant atoms 18 should be sufficient to enable such atoms to penetrate up to and slightly beyond the junction 15 between layers 14 and 16. Diffusion rates along the grain boundaries 22 are much higher than through the bulk of the semiconductor material; therefore very few n-dopant atoms will penetrate into the bulk of the semiconductor if the diffusion is kept relatively short. However, some diffusion into the bulk is not detrimental to performance.

As previously stated, an alternative to selectively electroplating the donor material onto semiconductor layer 16, excellent results have been achieved by vacuum depositing or electroplating the entire surface with an appropriate material such as tin (Sn). The structure is then heat treated to cause appropriate diffusion of the n-dopant atoms (tin) 18 into the grain boundaries 22 of layer 16 as shown in FIG. 2.

Two classes of heating cycles have been used. For heating cycles below the melting point of tin (232° C.), the tin is heated directly. For heating cycles above 232° C., an overlayer of a higher melting point metal may be used. In this case, a thin layer of electroplated silver prevents the "balling-up" of the tin, which would cause problems during chemical removal.

Heating cycles between a few seconds and a few minutes have been used.

Once these boundaries have been passivated by either of the above processes, any excess layer of tin on the surface of layer 16 is removed, for example, by chemical etching; and the structure is processed in the normal manner to produce, for example, a photovoltaic cell.

Figure 3:
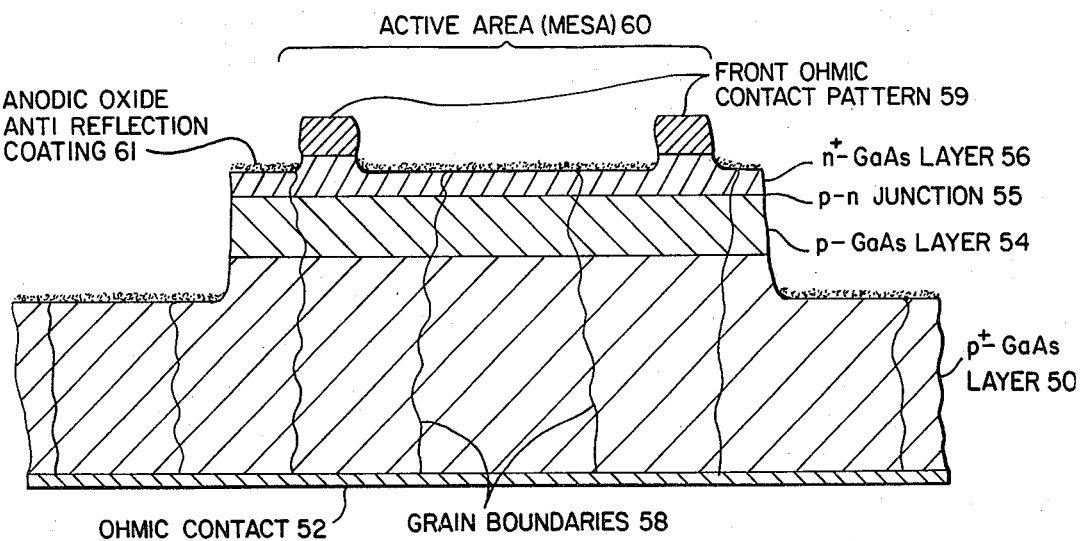
FIG. 3 is a schematic view of a photovoltaic cell in accordance with the invention.

A complete photocell fabricated in accordance with the invention is shown schematically in FIG. 3.

The starting material is a commercially available semiconductor wafer 50 of high purity polycrystalline gallium arsenide, zinc doped to be P+($10^{18}$ carriers/cm$^3$). This wafer has a crystallite grain size of approximately 1-5 mm and a thickness of 0.020".

Initially, the wafer is polished with a standard Clorox polish and residual damage removed with a sulfuric acid/hydrogen peroxide/water etch. After polishing, the wafer is placed in an epitaxial reactor of the type previously described by Bozler. See, Bozler, C. O., *Solid State Research Report*, Lincoln Laboratories, M.I.T., Vol. 2, p. 52 (1975). An epitaxial layer 54 of lightly doped ($10^{16}$ carriers/cm$^3$) p-type gallium arsenide is then deposited on wafer 50 with zinc dopant to a thickness of 2 μm, followed by application of an n+-layer formed from sulfur-doped gallium arsenide ($10^{18}$ carriers/cm$^3$) to a thickness of 0.5 μm. Thus, the epitaxial gallium arsenide layers 54 and 56 form a p-n junction 55 about 0.5 μm below the top surface.

Grain boundaries 58 originating in the original polycrystalline gallium arsenide wafer 50 propagate through the subsequently deposited gallium arsenide layers 54 and 56.

The grain boundaries in layer 56 are then passivated in accordance with the invention by diffusing n-type dopant atoms into layer 56. This is accomplished by electroplating a layer of tin onto the external surface of n+-layer 56 as previously described. The resultant structure is then subjected to a temperature of about 200° C. for about 60 seconds, sufficient to cause diffusion of such n-dopant into the grain boundaries 58 of layer 56 up to p-n junction 55 and slightly beyond. Very little diffusion will occur in the bulk of layer 56 in the relatively short time. Any residue of tin on the surface of layer 56 or any tin atoms diffused into the bulk of the layer are preferably removed by treating the surface with a chemical etchent.

Next, an ohmic contact 52 consisting of an electroplated gold or tin layer is applied to the back surface of the p+-layer 50. A front contact pattern is then photolithographically defined on the n+-layer 56. Using this pattern as a mask, an electroplated tin contact 59 is formed on the n+-layer 56. The photolithographic mask is then removed and a new pattern is photolithographically defined on the n+-layer 56. Using this pattern as a mask, the surrounding areas are chemically etched using a sulfuric acid/hydrogen peroxide/water solution to a depth of about 2 μm from the surface of the n+-layer 56. This etching defines the active area of the device 60. The photolithographic mask is then removed. To form an antireflection coating 61 as well as to optimize the photovoltaic response of the solar cell, the surface of the n+-layer 56 is then anodically oxidized (See J. C. C. Fan, C. O. Bozler, and R. L. Chapman, *Appl. Phys. Lett.*, 32, 390(1978)), using a solution of propylene glycol and water.

This completes the description of an n+/p/p+ embodiment of the invention. It should be noted that other equivalent structures are also contemplated and that the invention has applicability in any layered junction device where crystalline deflects or grain boundaries cause interstices to form with conductivity opposite to that desired in the layer. Also, we have discussed the advantages of fully compensating a grain boundary by diffusion of dopant until it reaches the least conducting state. In some applications it may also be beneficial to overdope a grain boundary and actually change its type of conductivity. Therefore, the term "compensation" as used herein is meant to include either "over-doping" or fully compensating as described above.

Equivalents

Those skilled in the art will recognize, or be able to ascertain using no more than routine experimentation, many equivalents or alternates to the specific embodiments in the invention described herein. Such equivalents are intended to be encompassed by the following claims.

We claim:

1. A compensation method for reducing the conductivity associated with the interstices formed in layers of polycrystalline semiconductor material wherein said layers form rectifying junctions at their interface, comprising introducing dopant into the interstices of a first layer of opposite type conductivity to the conductivity associated with the interstices of a second layer and allowing said dopant to travel along said interstices from the first layer, across the rectifying junction between layers and into the second layer.

2. A method of claim 1 wherein said dopant is of sufficient quantity to substantially equal the quantity of dopant originally associated with the interstices of the second layer.

3. A method of claim 2 wherein said dopant is provided by selectively electroplating material comprising atoms of said dopant (material) at the intersection of said interstices with a surface of said semiconductor material.

4. A method of claim 2 wherein said dopant is provided by disposing material comprising atoms of said dopant on the surface of said semiconductor material and subjecting the resultant structure to a temperature sufficient to cause diffusion of said dopant atoms into said interstices.

5. A method of claim 4 wherein diffusion is terminated prior to substantial diffusion of the dopant atoms into the bulk of the semiconductor material.

6. A method of claim 3 or 4 wherein said dopant atoms are n-type and the original conductivity of the interstice being compensated is p-type.

7. A semiconductor device produced by the process of claim 1.

8. A photovoltaic cell comprising a compensated semiconductor device produced according to the process of claim 1.

9. A device formed of semiconductor material and having a substrate, a first layer on said substrate of a certain type conductivity, a second layer on said first layer of opposite conductivity to said first layer and forming a junction therebetween, the improvement comprising compensating interstices in said second layer formed by introducing dopant into said second layer through interstices in the second layer and across said junction into the interstices of the first layer.

10. The device of claim 9 wherein said dopant is introduced by diffusion and the conductivity of the dopant is opposite the conductivity associated with the interstice.

11. The device of claim 9 in which the semiconductor material is GaAs and the dopant is Sn.

12. A photovoltaic cell comprising:
 (a) a substrate;
 (b) a first layer of doped semiconductor material formed on said substrate, the material of said first layer having a plurality of grain boundaries forming interstices;
 (c) a second layer of semiconductor material formed on said first layer and providing a rectifying junction with said first layer, the material of said second layer having a plurality of grain boundaries forming interstices;
 (d) a dopant for compensating the conductivity of interstices formed in said layers; said dopant being provided by diffusion from the interstices of the second layer through the junction to at least a portion of the first layer.

13. The photovoltaic cell of claim 12 including:
 (e) an ohmic contact on an external surface of said substrate;
 (f) an ohmic contact on an external surface of said second layer.

14. The photovoltaic cell of claim 12 having an anodized surface on the second layer.

15. The photovoltaic cell of claim 12 in which the semiconductor material is GaAs and the dopant is Sn.

16. A compensation method for reducing the conductivity associated with the interstices formed in layers of semiconductor material, comprising introducing dopant into the interstice of opposite type conductivity to the conductivity associated with the interstice and wherein the semiconductor material is GaAs and the dopant is Sn.

* * * * *